(12) United States Patent
Heng et al.

(10) Patent No.: US 8,020,120 B2
(45) Date of Patent: Sep. 13, 2011

(54) LAYOUT QUALITY GAUGE FOR INTEGRATED CIRCUIT DESIGN

(75) Inventors: Fook-Luen Heng, Yorktown Heights, NY (US); Mark A. Lavin, Katonah, NY (US); Jin-Fuw Lee, Yorktown Heights, NY (US); Thomas Ludwig, Sindelfingen (DE); Rama Nand Sing, Bethel, CT (US); Fanchieh Yee, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 11/865,252

(22) Filed: Oct. 1, 2007

(65) Prior Publication Data

US 2009/0089726 A1  Apr. 2, 2009

(51) Int. Cl.
*G06F 17/50* (2006.01)

(52) U.S. Cl. .................................. 716/52; 716/112

(58) Field of Classification Search .................. None
See application file for complete search history.

(56) References Cited

U.S. PATENT DOCUMENTS

| | | | |
|---|---|---|---|
| 4,593,363 A | 6/1986 | Burstein et al. | |
| 5,886,906 A * | 3/1999 | Tatsumi et al. | 703/14 |
| 6,324,673 B1 | 11/2001 | Luo et al. | |
| 6,507,938 B1 | 1/2003 | Roy-Neogi et al. | |
| 6,562,638 B1 * | 5/2003 | Balasinski et al. | 438/14 |
| 6,647,536 B2 | 11/2003 | Bradley et al. | |
| 6,681,376 B1 * | 1/2004 | Balasinski et al. | 716/4 |
| 6,725,437 B1 | 4/2004 | Rao et al. | |
| 6,886,148 B2 | 4/2005 | Solomon | |
| 7,049,589 B2 * | 5/2006 | Yamaguchi et al. | 250/310 |
| 7,085,698 B2 * | 8/2006 | Tsai et al. | 703/13 |
| 7,139,996 B2 * | 11/2006 | Ohnuma et al. | 716/19 |
| 7,624,369 B2 * | 11/2009 | Graur et al. | 716/19 |
| 7,653,890 B2 * | 1/2010 | Tsai et al. | 716/11 |
| 7,882,456 B2 * | 2/2011 | Zach | 977/834 |
| 2003/0061587 A1 * | 3/2003 | Zhang et al. | 716/11 |
| 2006/0150131 A1 | 7/2006 | Lai et al. | |
| 2008/0086708 A1 * | 4/2008 | Rittman | 716/11 |
| 2008/0127020 A1 * | 5/2008 | Rittman | 716/10 |
| 2009/0031264 A1 * | 1/2009 | Rittman et al. | 716/5 |

OTHER PUBLICATIONS

Heng et al., "Toward Through-Process Layout Quality Metrics," Design and Process Integration for Microelectronic Manufacturing III, Proc. of SPIE vol. 5756, 2005, pp. 161-167.*
Singh et al., "Layout-Aware Through-Process Circuit Analysis," 2007 IEEE, pp. 176-180.*
Rauch, "Analytic Calculation of Chip Image Probabilities," 1990, 2 pages.
Anderson, et al., "Method for reducing within chip device parameter variations", 3 pages.

* cited by examiner

*Primary Examiner* — Leigh Marie Garbowski
(74) *Attorney, Agent, or Firm* — Michael J. Buchenhorner; Stephen C. Kaufman

(57) ABSTRACT

A method for layout design includes steps or acts of: receiving a layout for design of an integrated circuit chip; designing mask shapes for the layout; transmitting the mask shapes to a litho simulator for generating wafer shapes; receiving the wafer shapes; calculating electrically equivalent gate lengths for the wafer shapes; analyzing the gate lengths to check for conformity against a threshold value, wherein the threshold value represents a desired value of electrically equivalent gate lengths; placing markers on the layout at those locations where the gate length violates the threshold value; and generating a histogram of gate lengths for comparing layouts for electrically equivalent gate lengths for layout quality.

18 Claims, 8 Drawing Sheets

LAYOUT QUALITY GAUGE FOR INTEGRATED CIRCUIT DESIGN

CROSS-REFERENCE TO RELATED APPLICATIONS

Not applicable.

STATEMENT REGARDING FEDERALLY SPONSORED-RESEARCH OR DEVELOPMENT

Not applicable.

INCORPORATION BY REFERENCE OF MATERIAL SUBMITTED ON A COMPACT DISC

Not Applicable.

FIELD OF THE INVENTION

The invention disclosed broadly relates to the field of integrated circuit design and more particularly relates to the field of physical design of layouts in the design of integrated circuits.

BACKGROUND OF THE INVENTION

A computer programmed with appropriate computer-aided design (CAD) software, called design-rule verification tools, is normally used to verify that a design of an integrated circuit (IC) chip conforms to certain predetermined tolerances that are required in its fabrication. These predetermined tolerances are often formatted as "rules" that are used by the design-rule verification tools to confirm that the IC layout does not violate any of the design rules. The process that confirms conformance of the layout of the IC to the design rules is called "design rule check" (DRC).

Examples of DRC rules to be used in checking an IC design include minimum width, minimum spacing between elements of a circuit, minimum width of notches, checks for acute angles and self-intersecting polygons, and enclosure and overlap checks. Such DRC rules can be applied to actual layers that are to be fabricated in the chip. Such DRC rules can also be applied to layers (called "derived layers") that are formed by logical operations (such as NOT, AND, OR, and XOR) on actual or derived layers or some combination thereof.

The goal in layout design, as always, is to reduce size and cost while improving the performance of the design. With the current trend of placing more and more transistors on a chip, this is becoming increasingly difficult. This trend results in shorter gate lengths which are more desirable to increase speed. The drawback with shorter gate lengths is that they produce more leakage.

In VLSI (Very Large Scale Integration) design, the common cell design library includes enough different cell types (latch, local clock buffer, gate level parameterized cells to name a few) to allow nearly any circuit to be implemented, avoiding the complexity of the hundreds of different macro calls that would be required by a commercial system. Traditionally, one circuit layout is considered superior to another by any one of the following reasons: circuit area, electrical characteristics, accessibility, via number (redundant contacts), timing distribution, power distribution.

Traditionally, layouts are considered valid if they satisfy the design rules whose validity has been determined by an integration team. The process is typically executed in VLSI CAD (Computer Aided Design) tools such as DRC CAD tools. (see U.S. Pat. No. 6,606,735, 2003, Richardson and Rigg: Method and system for using error and filter layers in each DRC rule). Referring to FIG. 1, there is shown an illustrative example of the traditional processing flow for a VLSI chip design. The input to the tool is the input layout in step 010. This input layout is then sent to a DRC tool in step 020 to check if the layout satisfies the design rules or it requires changes.

Once the layout is checked, for purposes of manufacturing, the design undergoes the processes of dataprep to transform the drawn shapes into mask shapes that are able to be printed by the litho tools and the resulting wafer shapes are then expected to conform to drawn shapes and the mask shapes are output in step 030.

Once a layout is declared "DRC clean," the VLSI designer no longer plays a role in the dataprep process.

Out of necessity, integrated circuit chip size is changing, along with the computer systems in which they are housed. Computers are becoming smaller and with the decrease in size we see an increase in their processing power. Chips must be thinner and many of them are now being stacked. With this increasing density and decreasing gate lengths, it is becoming critical to address the issue of uniformity of the printed electrically equivalent gate lengths.

SUMMARY OF THE INVENTION

Briefly, according to an embodiment of the invention a method for layout design includes steps or acts of: receiving a layout for design of an integrated circuit chip; designing mask shapes for the layout; transmitting the mask shapes to a litho simulator for generating wafer shapes; receiving the wafer shapes; calculating electrically equivalent gate lengths for the wafer shapes; analyzing the gate lengths to check for conformity against a threshold value, wherein the threshold value represents a desired value of electrically equivalent gate lengths; placing markers on the layout at those locations where the gate length violates the threshold value; and generating a histogram of gate lengths for comparing layouts for electrically equivalent gate lengths for layout quality.

According to an embodiment of the present invention. a layout quality gauge for assessing and enforcing layout quality in terms of uniformity of gate lengths derived from wafer shapes, includes: a tool configured for obtaining a description of a plurality of gates on the layout; a tool configured for obtaining a description of process variability; a tool configured for obtaining wafer shapes for the plurality of gates; a tool configured for describing the layout by measuring the device dependent electrically-equivalent gate lengths of the plurality of gates from their corresponding wafer shapes; a tool configured for measuring the device dependent electrically-equivalent gate lengths with respect to device on-current and/or device off-current of the plurality of gates from their corresponding wafer shapes; a tool configured for determining any gate within the plurality of gates that violates a predetermined uniformity of gate length threshold; a tool configured for flagging the gates that violate the threshold limit with a marker on the layout; and a tool configured for enabling enforcement and compliance of the layout to the layout quality uniformity requirements.

BRIEF DESCRIPTION OF THE DRAWINGS

To describe the foregoing and other exemplary purposes, aspects, and advantages, we use the following detailed description of an exemplary embodiment of the invention with reference to the drawings, in which.

DETAILED DESCRIPTION

We describe a layout quality gauge for a VLSI wafer for assessing layout quality in terms of the uniformity of gate lengths derived from wafer shapes. The layout quality gauge presented by this invention provides this capability to designers, IP Reviewers as well as EDA toolkits for VLSI. It is becoming increasingly important to provide the VLSI design and the intellectual property (IP) review teams with a reliable gauge that measures layout quality in terms of uniformity of gate lengths derived from wafer shapes and more importantly, to be able to diagnose and fix outliers on the layouts in the technology design library.

Figure 1:
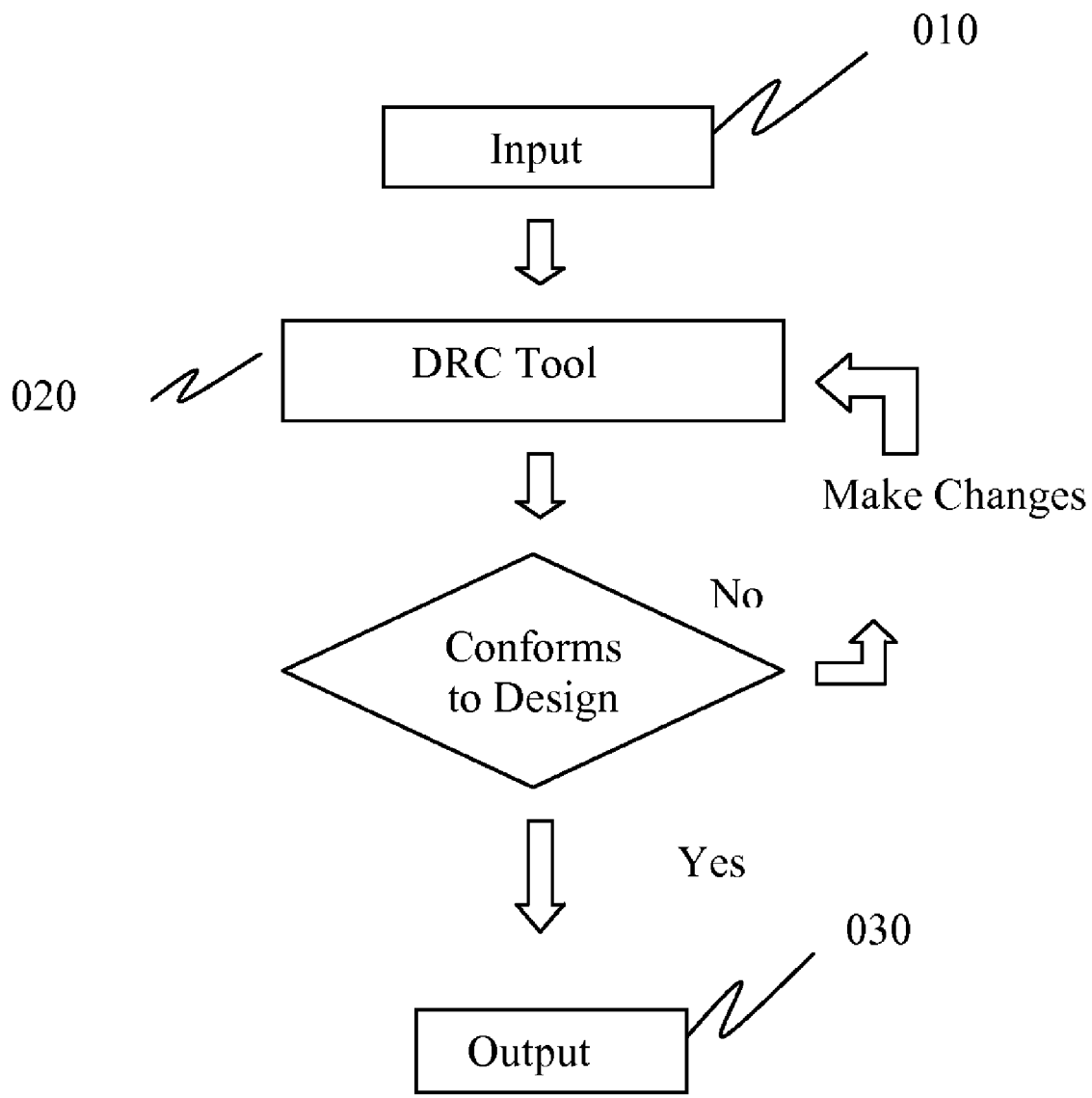
FIG. 1 depicts the processing flow for VLSI chip layout according to the known art.
Figure 2:
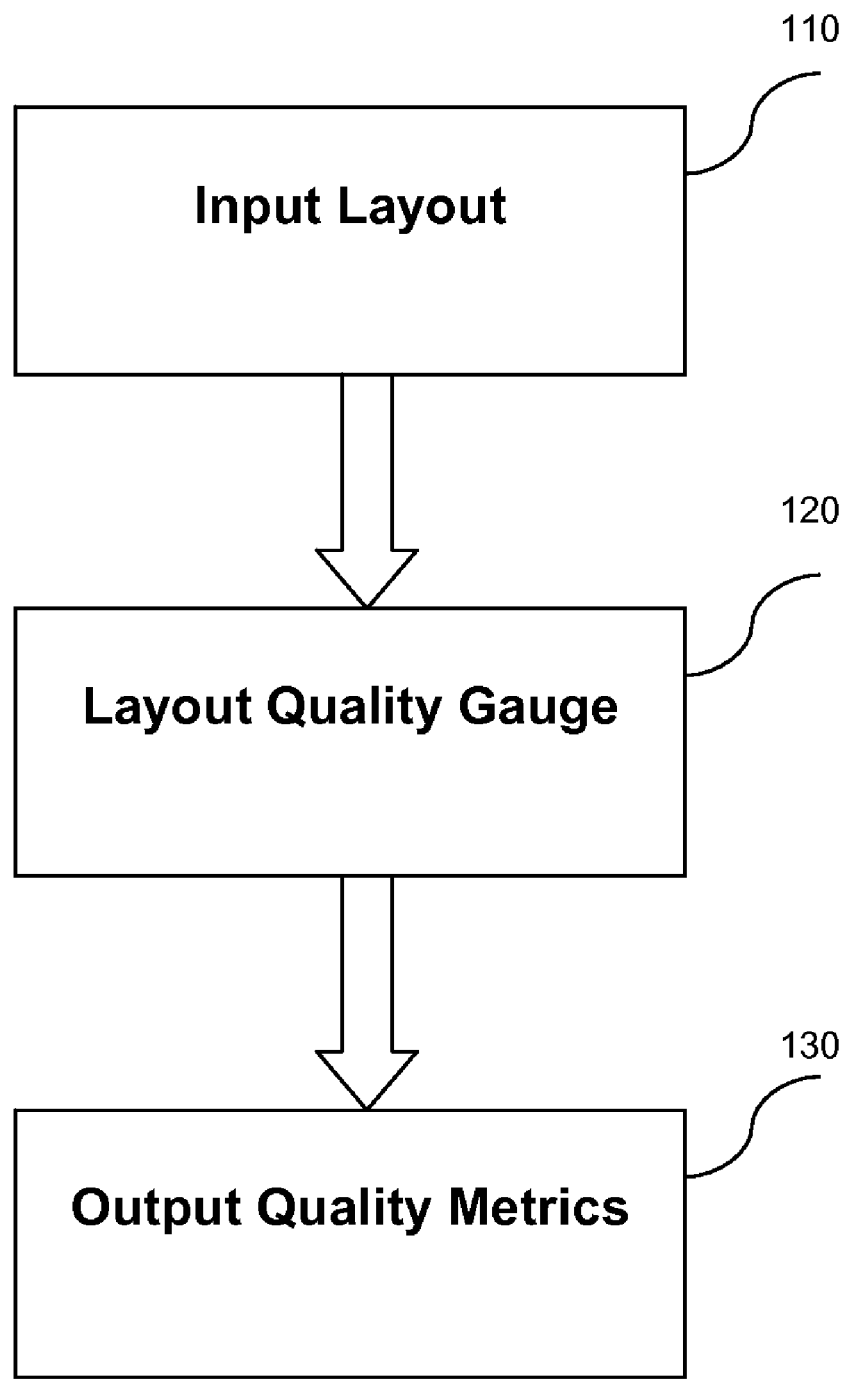
FIG. 2 depicts the processing flow for VLSI chip layout, according to an embodiment of the present invention.

Referring now to the drawings and more particularly to FIG. 2, there is shown a high level processing flow which has been instrumented with a layout quality gauge 120 and processes the input layout 110 to output quality metrics 130 by checking the quality of the physical layouts of VLSI designs according to the present invention.

Figure 3:
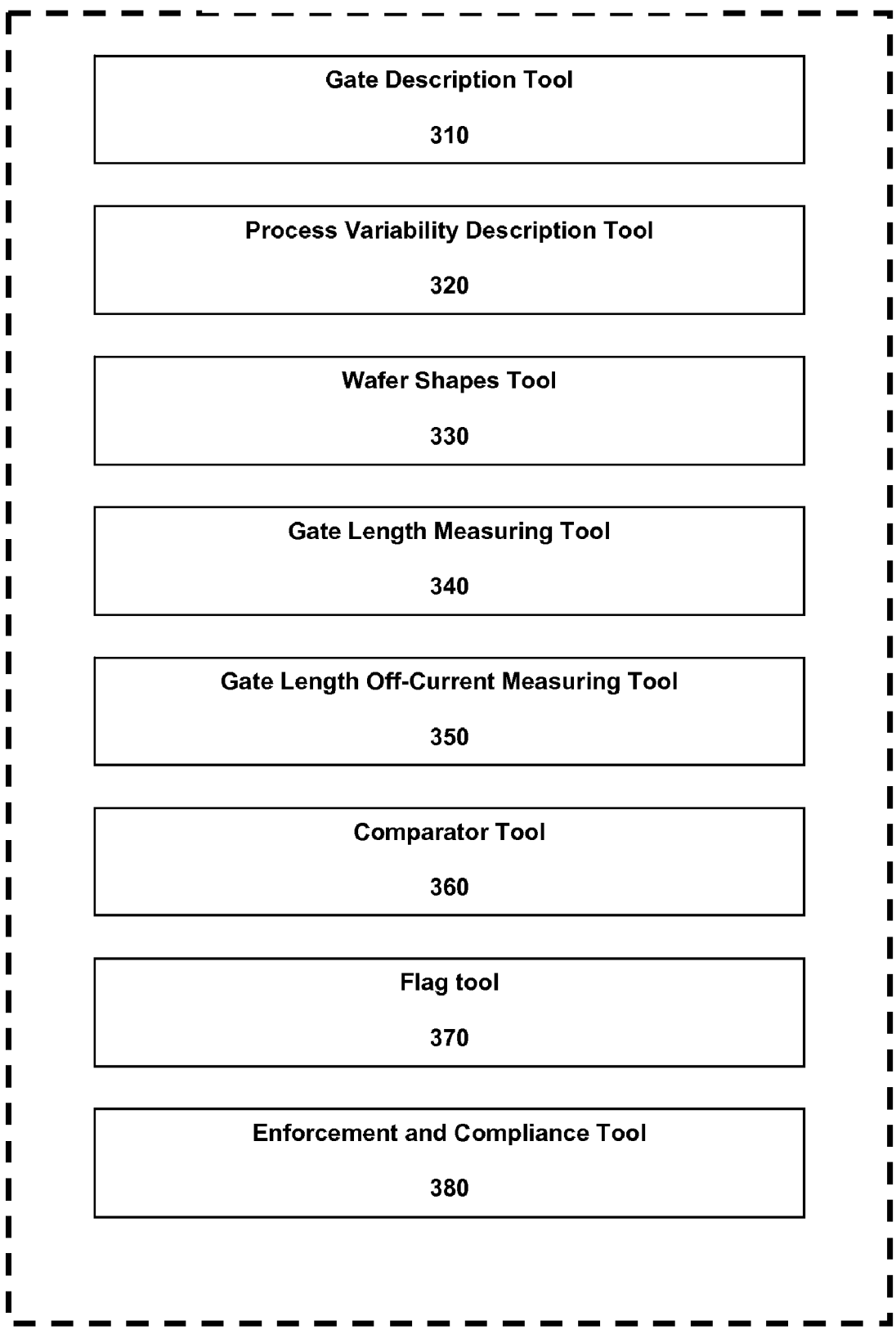
FIG. 3 is a simplified block diagram showing the components of a layout quality gauge, according to an embodiment of the present invention.

Referring now to FIG. 3, there is shown a simplified block diagram of the components of the layout quality gauge 120 of FIG. 2, configured to operate according to an embodiment of the present invention. The gauge 120 includes the components described below. Note that these are logical constructs and are not necessarily separate devices.

Gate Description Tool 310: obtains a description of the gates on the layout.

Process Variability Description Tool 320: obtains a description of the process variability.

Wafer Shapes Tool 330: obtains wafer shapes for the gates for the process conditions described by 320.

Gate Length Measuring Tool 340: measures the device dependent electrically-equivalent gate lengths of the gates with respect to the device on-current from their corresponding wafer shapes.

Gate Length Off-Current Measuring Tool 350: measures the device dependent electrically-equivalent gate lengths of the gates with respect to the device off-current from their corresponding wafer shapes.

Comparator Tool 360: acts as a comparator to determine any gate that violates a predetermined uniformity threshold description.

Flag Tool 370: flags the gates that violate the threshold with a marker on the layout.

Enforcement and Compliance Tool 380: enables enforcement and compliance of the layout to the layout quality gate length uniformity prescription.

Figure 4:
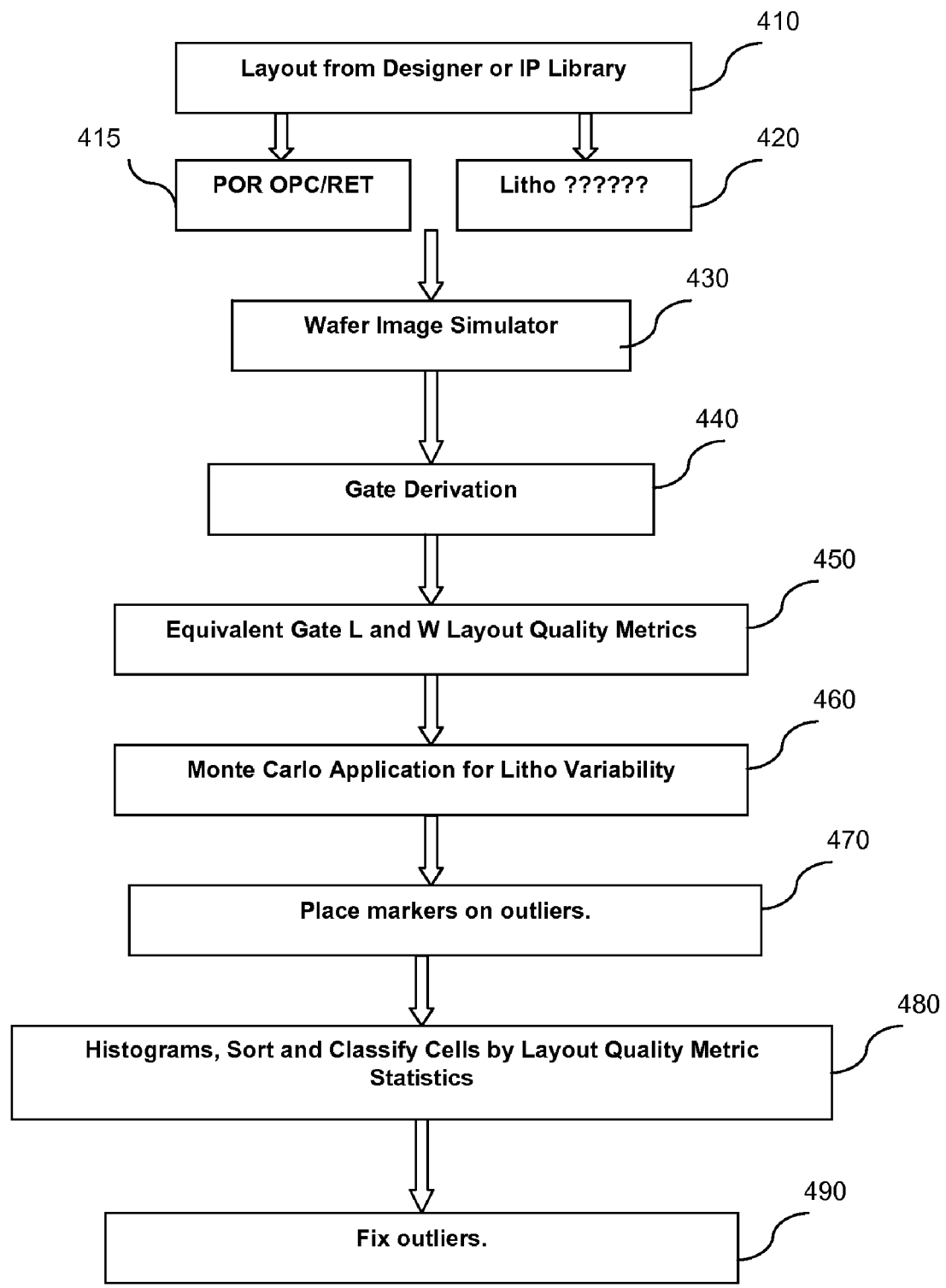
FIG. 4 is a flow chart of the process of implementing the layout quality gauge, according to an embodiment of the present invention.

Referring to FIG. 4 there is shown a flow chart illustrating the process for chip design, implementing the layout quality gauge for assessing uniformity of gate lengths, according to an embodiment of the present invention. The process begins upon receipt of the layout from the designer's desk or from an IP library in step 410. At this point the layout undergoes the Plan of Record DataPrep, including optical proximity correction and resolution enhancement technology (POR OPC/RET) selection in 415 to generate mask shapes.

In step 420 the process probability density distributions are used to determine the process window of the litho printer. Thus the parameters of the printing process such as the exposure focus, exposure dose, etch, overlay and mask error are chosen to perform litho simulation.

Next, in step 430 the mask shapes are sent to a litho simulator to generate wafer shapes in the form of contours throughout the process window. Following in step 440, the contours are processed through a shapes processor to compute gates over the layout for each process point in the process window.

Step 450: The gate lengths are now determined, not by their geometrical characterizations, but by the device models to calculate equivalent gate lengths using both the delay and leakage tables (as described in "Towards Through-Process Layout Quality Metrics," Fook-Luen Heng, Jin-fuw Lee, and Puneet Gupta, Proceedings of the SPIE, Vol 5756, pp 161-167).

Step 460: Using the process parameters probability density distributions, a Monte Carlo analysis over the process window determines the median and 3 sigma of the gate lengths of gates over the layout and checks against a threshold value for the equivalent gate length specified and independently determined by the designer of the integrated circuit. The Monte Carlo method finds the definite integral of a function by selecting a large number of independent-variable samples at random from within an interval or region, averaging the resulting dependent-variable values, and then dividing by the span of the interval or the size of the region over which the random samples were chosen.

Figure 5:
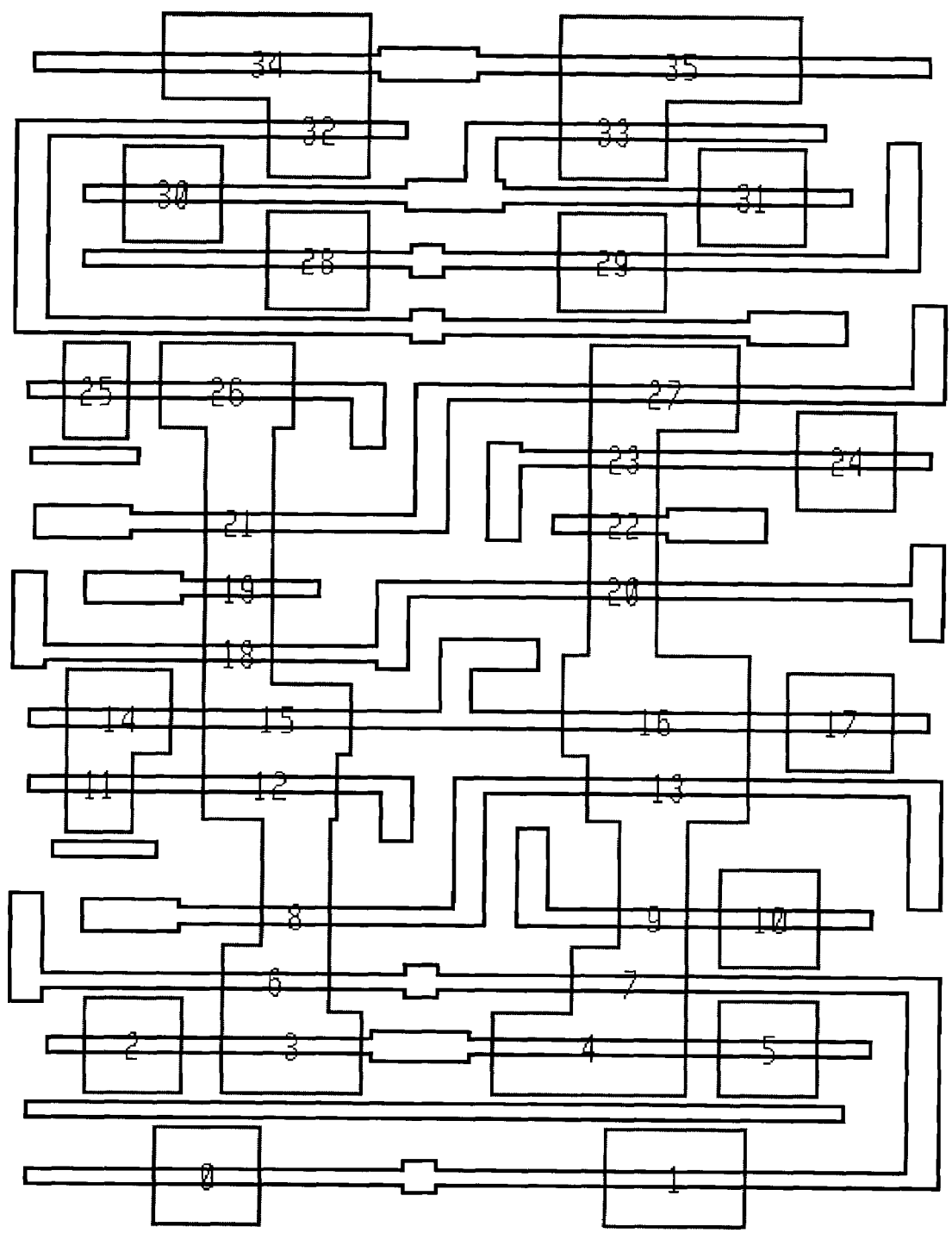
FIG. 5 is an example of a layout where the plurality of gates on the layout are annotated by serial identifications.

Note, up to this point, the process establishes a computing methodology. This is now followed by the following two steps to become a layout quality gauge for measuring and checking the uniformity of electrically equivalent gate lengths across the integrated circuit layout:

Step 470: Using the threshold value specified in step 460 by the designer to meet his performance target, markers are placed on the layout on those locations where the gate length violates the threshold (the outliers). A CAD tool may be used to set the markers. FIG. 5 shows an example of a layout where the plurality of gates on the layout are annotated by serial identifications.

Figure 6:
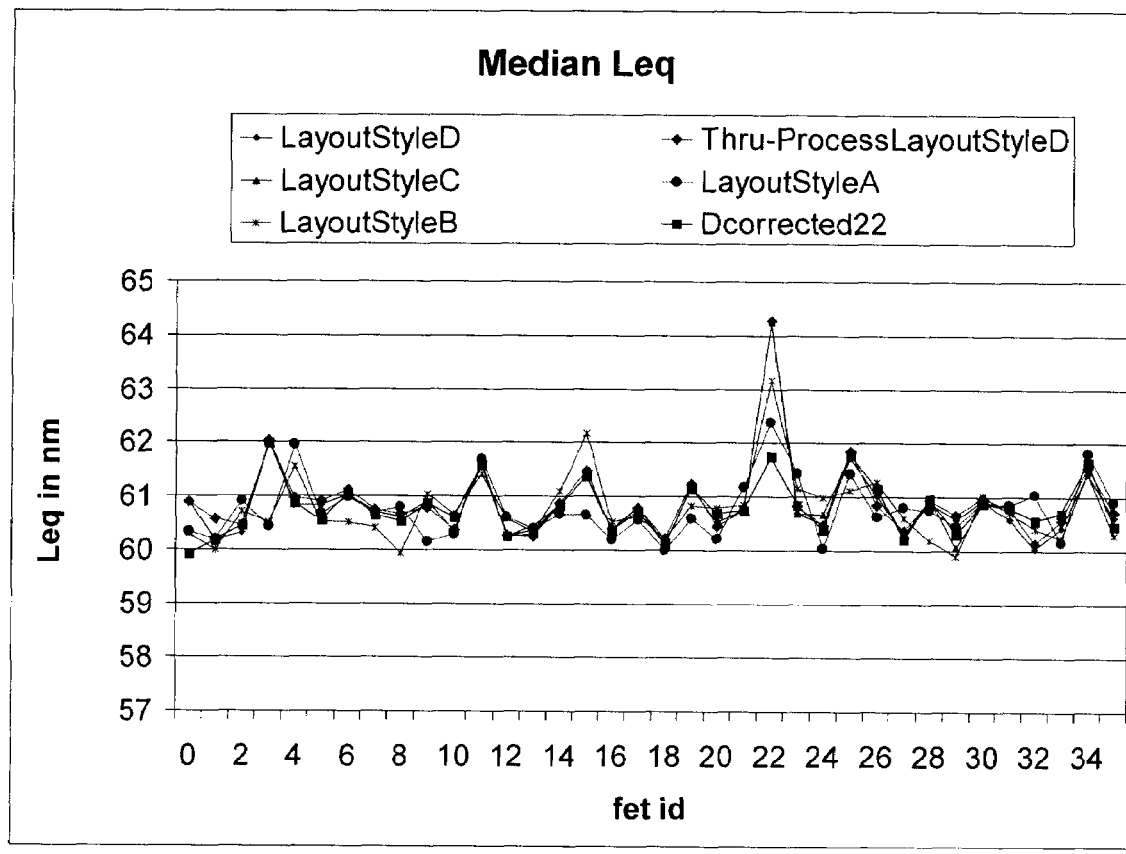
FIG. 6 is a plot of the electrically equivalent gate lengths of the plurality of gates in FIG. 5 showing that if a threshold is set at 62 nm, gate with a serial identification of 22 is a violating gate.
Figure 7:
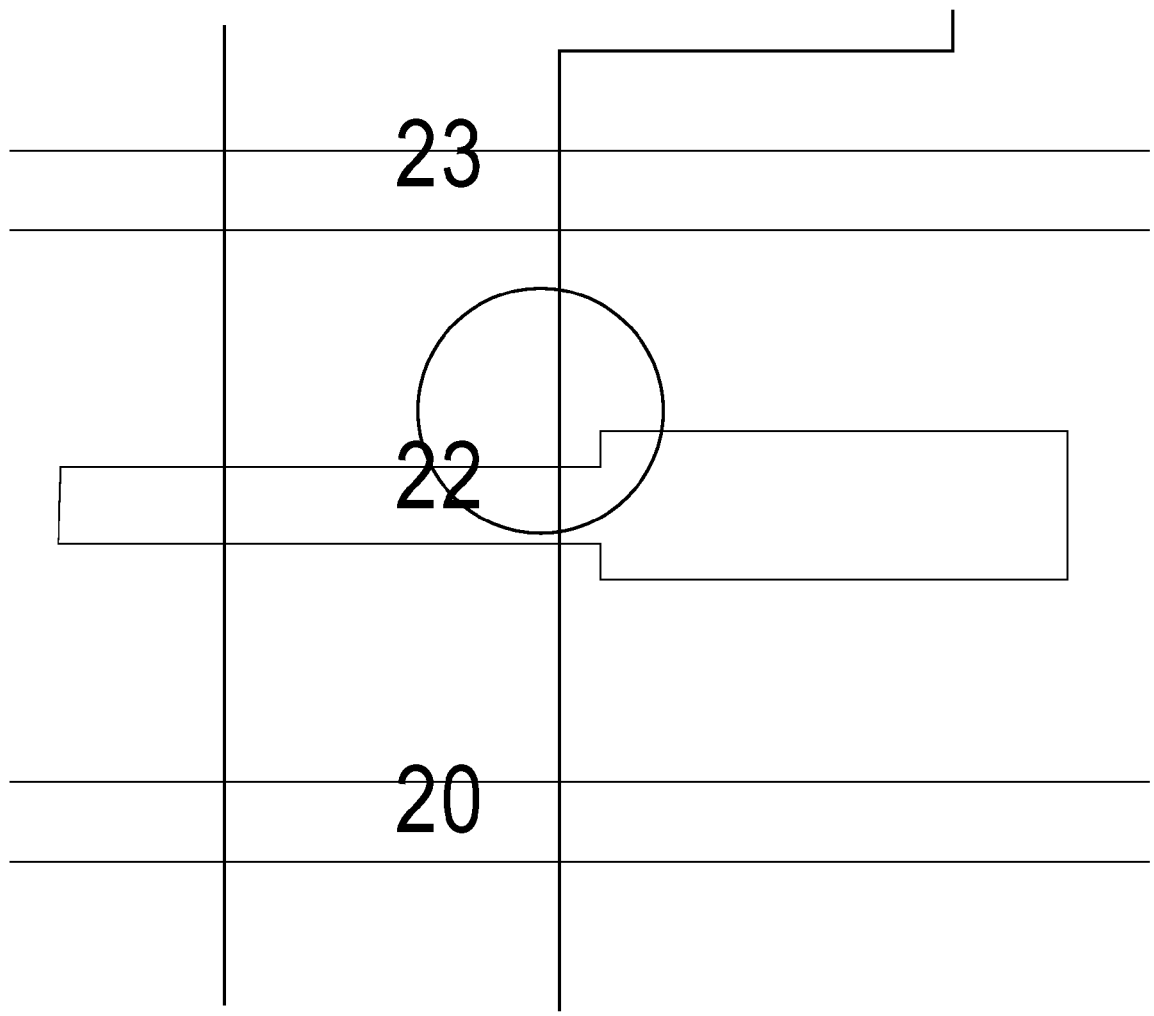
FIG. 7 is an example of a marker, shown by the circle, placed on the location of the layout with a serial identification 22 that is found to violate the equivalent gate threshold.

FIG. 6 is a plot of the electrically equivalent gate lengths of the plurality of gates in FIG. 5 showing that if a threshold is set at 62 nm, the gate with a serial identification of 22 is a violating gate. FIG. 7 is an example of a marker, shown by the circle, placed on the location of the layout with serial identification 22 that is found to violate the equivalent gate threshold (an outlier). The number and magnitude of the violation serves as a layout quality.

Figure 8:
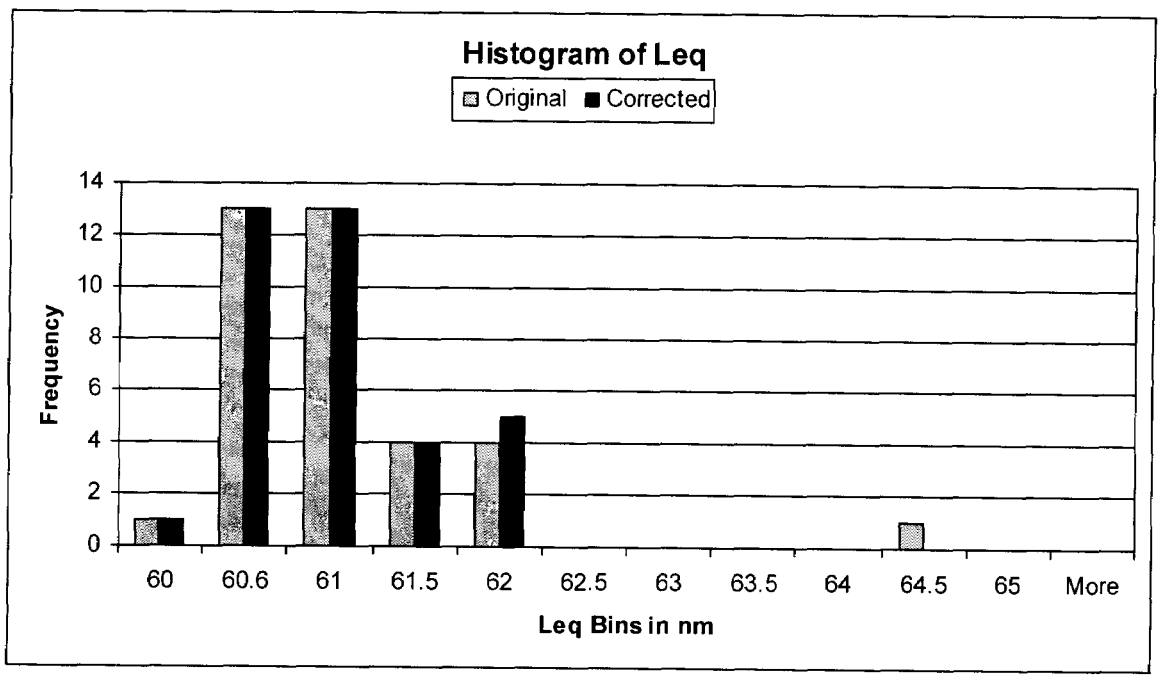
FIG. 8 is an example of a histogram created according to an embodiment of the present invention which shows the results on two versions, uncorrected and corrected, of a layout.

Step 480: A histogram of median equivalent gate lengths 3 sigmas over the layout may be generated to compare layouts for layout quality. FIG. 8 shows an example of a histogram, according to an embodiment of the present invention in which the results on two versions, an uncorrected original and a corrected version of a layout, originally containing an outlier as indicated in FIG. 7, are shown.

In step 490 the designer can then fix the outliers and select the layout style that provides the highest quality design. Alternatively, the VLSI Designer may elect to choose any layout.

According to another embodiment of the invention, a computer program product tangibly embodied on a computer readable medium includes code that, when executed, causes a computer to perform the following: receive a layout for design of an integrated circuit chip; obtain mask shapes designed for the layout; transmit the mask shapes to a litho simulator for generating wafer shapes; receive the generated wafer shapes from the litho simulator; calculate electrically equivalent gate lengths for the wafer shapes; analyze the gate lengths to check conformity against a threshold value, wherein the threshold value represents a desired value of electrically equivalent gate length; place markers on the layout at those locations where the gate length violates the threshold value; and generate a histogram of gate lengths for comparing layouts for layout quality by checking conformity to specified variation of electrically equivalent gate lengths.

According to another embodiment of the invention a system for providing a service includes: a memory having program code stored therein; and a processor operatively connected to the memory for carrying out instructions in accordance with the stored program code. The program code, when executed by said processor, causes the processor to: receive a layout for design of an integrated circuit chip; obtain mask shapes designed for the layout; transmit the mask shapes to a litho simulator for generating wafer shapes; receive the wafer shapes; calculate electrically equivalent gate lengths for the wafer shapes; analyze the gate lengths to check conformity against a threshold value, wherein the threshold value represents a desired value of electrical equivalence between gates; place markers on the layout at those locations where the gate length violates the threshold value; and generate a histogram of gate lengths for comparing layouts for layout quality by checking conformity to specified variation of electrically equivalent gate lengths.

The method as described above may be performed for a second party user such as a client, for a fee.

Therefore, while there has been described what is presently considered to be the preferred embodiment, it will be understood by those skilled in the art that other modifications can be made within the spirit of the invention.

The invention claimed is:

1. A system for assessing and enforcing layout quality in terms of uniformity of gate lengths derived from wafer shapes in very large scale integrated chip (VLSI) design, the system comprising:
a processor configured for:
receiving as input a layout of a VLSI chip;
obtaining a description of a plurality of gates on the layout, comprising obtaining a threshold value for a predetermined uniformity of gate length; and
obtaining a description of process variability specifying process conditions;
a shape processor configured for obtaining wafer shapes to compute gates over the layout for each process point in a process window;
the processor further configured for:
describing the layout by measuring the device dependent electrically-equivalent gate lengths of said plurality of gates from their corresponding wafer shapes;
measuring the device dependent electrically-equivalent gate lengths of said plurality of gates from their corresponding wafer shapes that are equivalent with respect to device off-current;
determining any gate within said plurality of gates that violates the predetermined uniformity of gate length threshold; and
flagging the gates that violate the threshold as outliers, wherein the flagging comprises placing a marker on the layout where the outlier is located; and
a tool for generating a histogram of gate lengths across the layout and across the process window, wherein a number and magnitude of the violation serves as a layout quality gauge.

2. The system of claim 1 further comprising a computer-aided design tool used for flagging the gates.

3. The system of claim 1 wherein a Monte Carlo method is used for measuring the device dependent electrically-equivalent gate lengths.

4. The system of claim 1 wherein the tool is implemented as software.

5. The system of claim 1 wherein the tool is implemented as hardware.

6. The system of claim 1 wherein the tool is implemented as firmware.

7. The system of claim 1 further comprising:
at least one delay current table; and
at least one leakage current table.

8. The system of claim 7 further comprising device models used to calculate equivalent gate lengths using both the delay and the leakage tables.

9. The system of claim 1 further comprising:
a litho simulator.

10. A method for layout design, the method comprising steps of:
using a processor for: receiving a layout for design of an integrated circuit chip;
obtaining a description of process variability specifying process conditions;
obtaining mask shapes designed for the layout, subject to the specified process conditions to compute gates over the layout for each process point in a process window;
transmitting the mask shapes to a litho simulator for generating wafer shapes;
receiving the wafer shapes from the litho simulator;
calculating electrically equivalent gate lengths for the wafer shapes;
analyzing the gate lengths for conformance to threshold values, wherein the threshold values represent acceptable values of electrically equivalent gate lengths;
placing markers on the layout at those locations where the gate length violates the threshold value; and
generating a histogram of the gate lengths for comparing the layout to other layouts for layout quality by checking conformity to specified variations of electrically equivalent gate lengths.

11. The method of claim 10 wherein the analyzing step comprises implementing a Monte Carlo method.

12. The method of claim 10 wherein the calculating step comprises a step of:
determining gate lengths by device models to calculate equivalent gate lengths using both delay and leakage tables.

13. The method of claim 10 wherein the step of placing markers comprises using a computer-aided design tool.

14. The method of claim 10 wherein the step of generating the histogram comprises steps of:
  graphically representing a number and magnitude of outliers, wherein the outliers are the gate lengths that violate the threshold value; and
  using the graphical representation as the layout quality gauge.

15. The method of claim 14 further comprising a step of: fixing the outliers.

16. The method of claim 10 wherein at least one of the steps is performed by program code executed as software.

17. The method of claim 10 further comprising a step of: annotating the gates on the layout using serial identification.

18. A computer program product tangibly embodied on a non-transitory computer readable medium and storing code that, when executed, causes a computer to perform a method comprising:
  receive a layout for design of an integrated circuit chip;
  obtaining a description of process variability specifying process conditions;
  obtain mask shapes designed for the layout, subject to the specified process conditions to compute gates over the layout for each process point in a process window;
  transmit the mask shapes to a litho simulator for generating wafer shapes;
  receive the generated wafer shapes from the litho simulator;
  calculate electrically equivalent gate lengths for the wafer shapes;
  analyze the gate lengths to check conformity against a threshold value, wherein the threshold value represents a desired value of electrically equivalent gate length;
  place markers on the layout at those locations where the gate length violates the threshold value; and
  generate a histogram of gate lengths for comparing the layout to other layouts for layout quality by checking conformity to specified variation of electrically equivalent gate lengths.

* * * * *